(12) United States Patent
Park et al.

(10) Patent No.: US 7,850,500 B2
(45) Date of Patent: Dec. 14, 2010

(54) METHOD OF FABRICATING ORGANIC LIGHT EMITTING DISPLAY

(75) Inventors: Joon-Young Park, Seoul (KR); Jang-Hyuk Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1025 days.

(21) Appl. No.: 11/128,178

(22) Filed: May 13, 2005

(65) Prior Publication Data

US 2005/0264184 A1    Dec. 1, 2005

(30) Foreign Application Priority Data

May 28, 2004    (KR)    ........................ 10-2004-0038047

(51) Int. Cl.
    *H01J 9/24*    (2006.01)
(52) U.S. Cl. ......................................... 445/24; 313/504
(58) Field of Classification Search ................. 313/504, 313/512; 445/24
    See application file for complete search history.

(56) References Cited

U.S. PATENT DOCUMENTS

| | | | |
|---|---|---|---|
| 5,952,778 A * | 9/1999 | Haskal et al. ................ 313/504 |
| 6,326,936 B1 * | 12/2001 | Inganas et al. ................ 345/55 |
| 6,466,292 B1 * | 10/2002 | Kim ............................ 349/143 |
| 2002/0014834 A1 * | 2/2002 | Uchida et al. ............... 313/504 |
| 2002/0190924 A1 * | 12/2002 | Asano et al. .................. 345/55 |
| 2003/0127971 A1 * | 7/2003 | Hofstra et al. .............. 313/504 |
| 2003/0156239 A1 * | 8/2003 | Inoue et al. ................. 349/113 |
| 2004/0239658 A1 * | 12/2004 | Koyama et al. ............. 345/204 |
| 2005/0099118 A1 * | 5/2005 | Kobayashi .................. 313/506 |

FOREIGN PATENT DOCUMENTS

JP          2001305525 A    * 10/2001

* cited by examiner

*Primary Examiner*—Toan Ton
*Assistant Examiner*—Hana S Featherly
(74) *Attorney, Agent, or Firm*—H.C. Associates, PLC

(57) ABSTRACT

A method of fabricating an organic light emitting display is provided, in which, a first electrode is formed above a substrate having first and second regions, respectively, an emission layer is formed in the first and second regions, a second electrode is formed on the emission layer in the first and second regions, and a reflecting layer pattern is selectively formed on the second electrode in the second region.

18 Claims, 2 Drawing Sheets

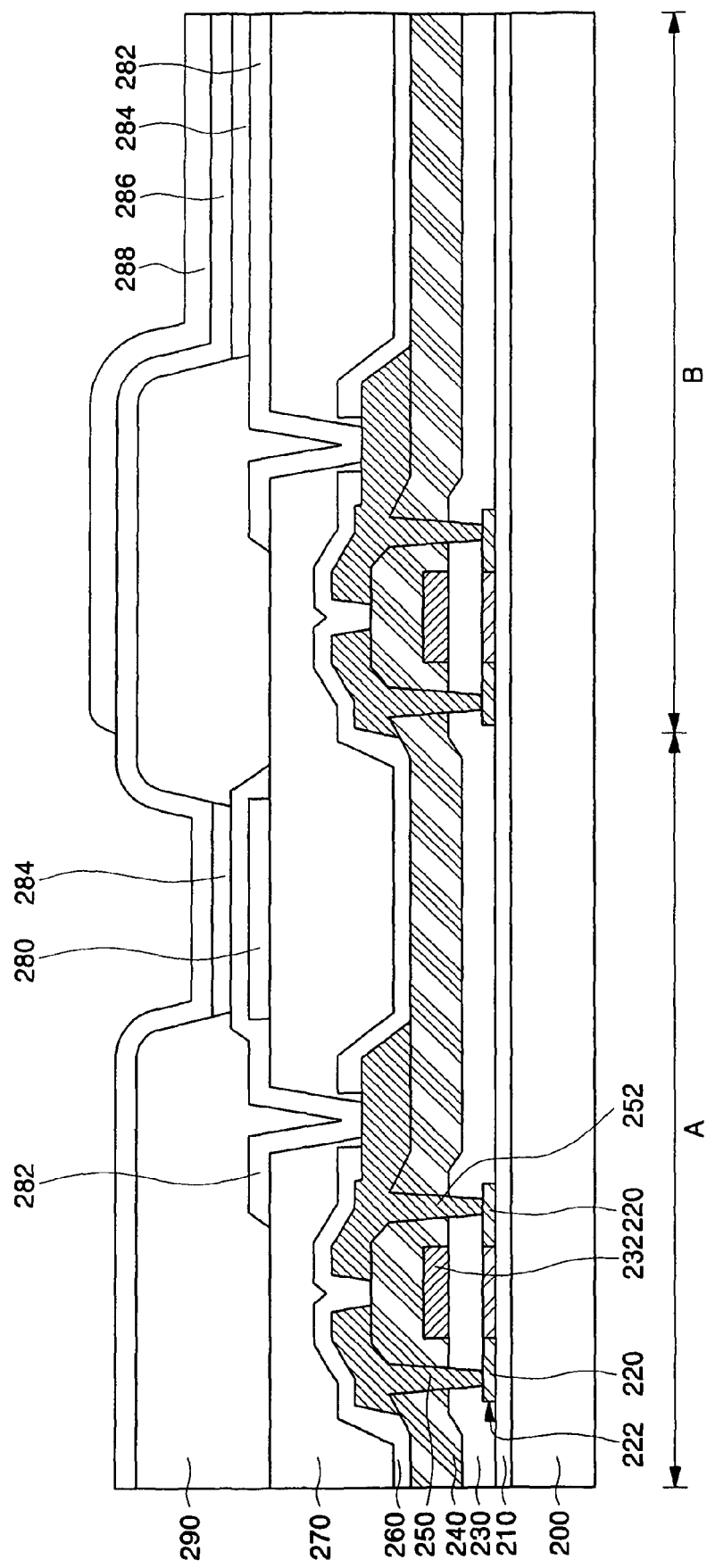

_US 7,850,500 B2_

METHOD OF FABRICATING ORGANIC LIGHT EMITTING DISPLAY

CROSS-REFERENCE TO RELATED APPLICATION

This application claims priority to and the benefit of Korean Patent Application No. 2004-38047, filed May 28, 2004, which is hereby incorporated by reference for all purposes as if fully set forth herein.

BACKGROUND OF THE INVENTION

1. Field of the Invention

The present invention relates to a method of fabricating an organic light emitting display (OLED) and, more particularly, to a method of forming an opposite electrode of an OLED having a top emission region and a bottom emission region such that the opposite electrode is simultaneously formed on the top emission region and the bottom emission region.

2. Description of the Related Art

An OLED is an emissive display that emits light by electrically exciting a fluorescent organic compound. The OLED is classified into a passive matrix type and an active matrix type depending on how driving pixels are arranged in a matrix or array form. The active matrix OLED consumes less power and has a higher resolution than the passive matrix OLED; therefore, the active matrix OLED is better suited for a large-sized display. The OLED is further classified into a top emission type, a bottom emission type, and a double-sided emission type based on a direction of light emitted from the organic compound. For example, the top emission OLED emits light in an opposite direction to a substrate having unit pixels and has a high aperture ratio.

Demands for an OLED which incorporates both a main display, which is a top emission type, and an auxiliary display, which is a bottom emission type, is increasing for small-sized and low power consumption devices, such as cellular phones, handheld wireless devices, etc. Such type of the OLED is commonly used in cellular phones, which have a main display on one side and an auxiliary display on the other side. For example, when the cellular phone is in an idle mode, a user may observe such things as a call receiving state, battery information, time, etc., through the auxiliary display.

FIG. 1a is a cross-sectional view of a conventional top emission OLED. Referring to FIG. 1a, a buffer layer 110 having a predetermined thickness is formed on a substrate 100, and then a thin film transistor (TFT) having a polysilicon pattern 122, a gate electrode 132 and source and drain electrodes 150 and 152 is formed on the buffer layer 110. Source and drain regions 120, which are ion-implanted, are formed at opposite sides of the polysilicon pattern 122, and a gate insulating layer 130 is formed on the entire surface of the structure including the polysilicon pattern 122. The gate electrode 132 is formed on the gate insulating layer 130, and an interlayer insulating layer 140 is formed on gate electrode 132 and the gate insulating layer 130.

A passivation layer 160 having a predetermined thickness is subsequently formed on the entire surface of the structure and is etched by a photolithography process to form a first via contact hole (not shown) which exposes one, for example, the drain electrode 152, of the source and drain electrodes 150 and 152. The passivation layer 160 may be formed of a silicon nitride layer, a silicon oxide layer or a stacked layer of the silicon nitride layer and the silicon oxide layer.

A first insulating layer 170 is formed on the entire surface of the structure. The first insulating layer 170 may be made of polyimide, benzocyclobutene-series resin, spin on glass (SOG), or acrylate. The first insulating layer 170 is formed for planarization of an emission region.

Subsequently, the first insulating layer 170 is etched by a photolithography process to form a second via contact hole (not shown), which exposes the first via contact hole.

A reflecting layer (not shown) is subsequently formed on the entire surface of the structure. The reflecting layer is made of a material having a high reflectivity, such as aluminum, an aluminum alloy, molybdenum, titanium, gold, silver, and palladium.

The reflecting layer is subsequently etched by a photolithography process to form a reflecting layer pattern 180 in the emission region.

A thin layer for a pixel electrode (not shown) is subsequently formed on the entire surface of the structure. The pixel electrode thin layer is made of a transparent metal material, such as indium tin oxide (ITO).

The pixel electrode thin layer is subsequently etched by a photolithography process to form a pixel electrode 182. The pixel electrode 182 contacts one of the source and drain electrodes 150 and 152, e.g, the drain electrode 152 exposed by the second via contact hole. The pixel electrode 182 has a dual-layer structure including the reflecting layer pattern 180.

A second insulating layer (not shown) is subsequently formed on the entire surface of the structure. The second insulating layer may be made of polyimide, benzocyclobutene, phenol-series resin, or acrylate. The second insulating layer is etched by a photolithography process to form a second insulating layer pattern 190 defining an emission region.

An emission layer 184 is formed in the emission region defined by the second insulating layer pattern 190 using a low molecular deposition technique or a laser induced thermal imaging technique. The emission layer 184 includes an organic emission layer (not shown) and at least one of an electron injection layer, an electron transport layer, a hole injection layer, a hole transport layer, and a hole blocking layer (not shown).

A magnesium-silver (Mg—Ag) layer is subsequently formed on the entire surface of the structure to form an opposite electrode 186a. The Mg—Ag layer is a transparent metal layer that transmits light emitted from the emission layer 184.

FIG. 1b is a cross-sectional view of a conventional bottom emission OLED. Referring to FIG. 1b, when the second via hole of FIG. 1a is formed, a pixel electrode 182 is formed that contacts one of the source and drain electrodes 150 and 152. The pixel electrode 182 of FIG. 1b may have a thickness different from a thickness of the pixel electrode 182 of FIG. 1a due to emission characteristics of the OLED.

A second insulating layer pattern 190 is subsequently formed over the structure to define an emission region of the pixel electrode 182. An emission layer 184 is subsequently formed in the emission region of the pixel electrode 182.

A LiF layer 186b is subsequently formed on the entire surface of the structure. The LiF layer 186b is an interface layer between an emission layer 184, e.g., an organic layer of the emission layer 184, and a reflecting electrode 188 and is approximately 10 Å thick to decrease a work function of the reflecting electrode 188. For example, the reflecting electrode 188 may be made of aluminum.

The reflecting electrode 188 is formed on the LiF layer 186b. The reflecting electrode 188 is formed using a thermal deposition method or a sputtering method. A stacked structure or combination of the LiF layer 186b and the reflecting electrode 188 is used as an opposite electrode.

Alternatively, an opposite electrode having a stacked or combined structure of an Mg—Ag layer and an aluminum layer may be formed after forming the emission layer.

In the OLED described above, the top emission OLED has a different structure than the bottom emission OLEDs relating to formation of the pixel electrode and the opposite electrode. Therefore, forming the top emission OLED and the bottom emission OLED on a single substrate complicates the fabrication process. Further, since the LiF layer of the bottom emission OLED is formed relatively thin, for example, the LiF layer is approximately 10 Å thick, when the reflecting electrode 188 is formed of aluminum using a sputtering method, the emission layer and the pixel electrode are adversely affected because the aluminum, or material used to form the reflecting electrode 188, enters the emission layer 184 through pores in the LiF layer 186*b* and degrades electrical and optical characteristics of the display. To solve at least the above-described problems, a thermal deposition method may be used to form the aluminum layer; however, this is a very unstable and time consuming process.

SUMMARY OF THE INVENTION

The present invention provides a method of fabricating an OLED that simplifies a fabrication process by simultaneously forming an opposite electrode using a same material in a top emission region and a bottom emission region, and may improve display reliability of the OLED by making it easy to form a reflecting layer which constitutes the opposite electrode in the bottom emission region.

According to an embodiment of the invention, there is provided a method of fabricating an organic light emitting display, including forming a first electrode above a substrate having first and second regions, respectively, forming an emission layer in the first and second regions, forming a second electrode on the emission layer in the first and second regions, and selectively forming a reflecting layer pattern on the second electrode in the second region.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other features of the present invention will be described in reference to certain exemplary embodiments thereof with reference to the attached drawings:

FIG. 2 is a cross-sectional view of an OLED according to an embodiment of invention.

DETAILED DESCRIPTION OF THE INVENTION

Figure 1A:
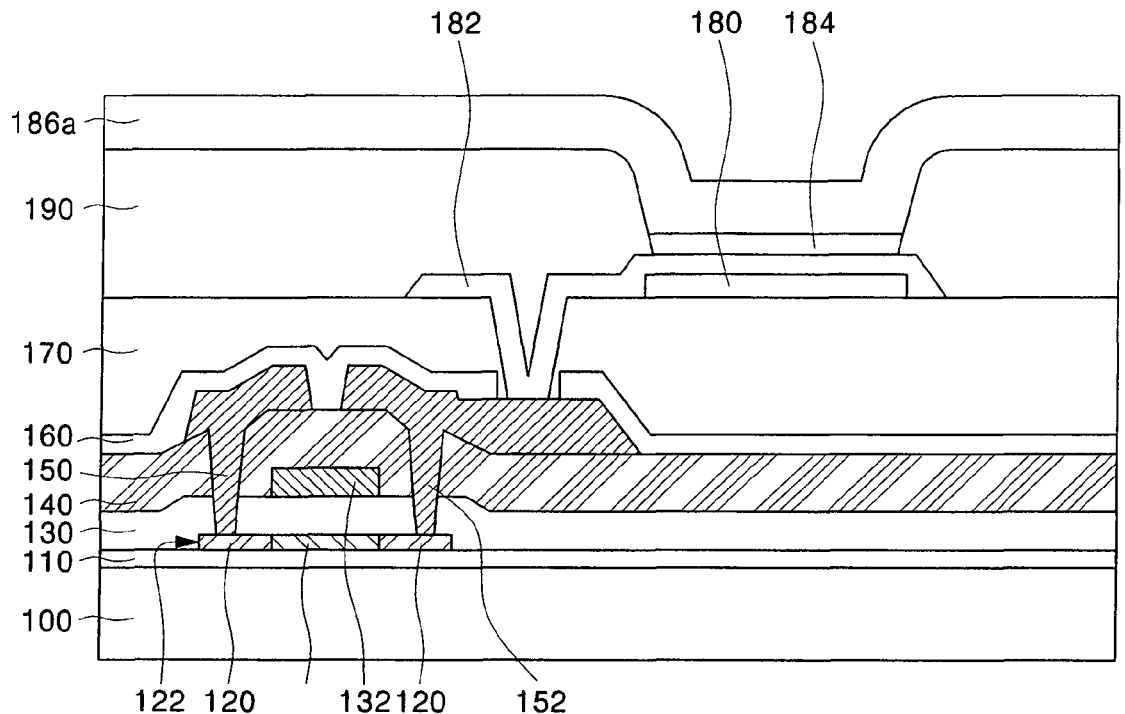
FIG. 1A is a cross-sectional view of a conventional top emission OLED.
Figure 1B:
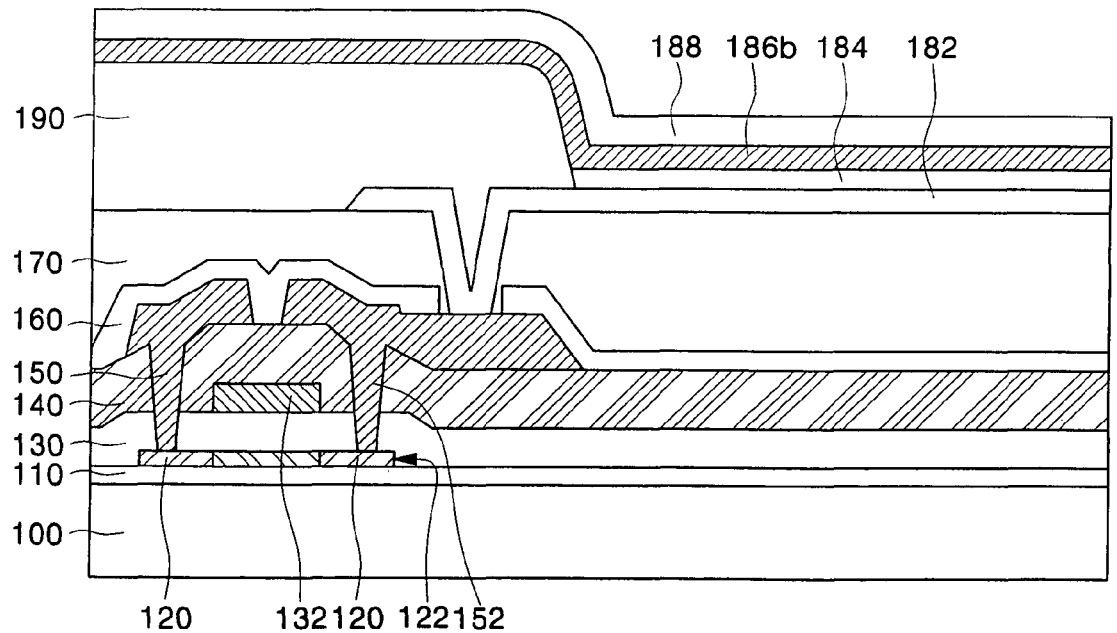
FIG. 1B is a cross-sectional view of a conventional bottom emission OLED.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 2 is a cross-sectional view of an OLED according to an embodiment of the invention. It is understood that the invention is not limited to the embodiment shown in FIG. 2. Referring to FIG. 2, the OLED of FIG. 2 includes a first region A and a second region B. The processes discussed below are simultaneously performed in the first and second regions A and B unless otherwise described. However, it is understood that the processes formed in the first and second regions A and B do not need to be performed simultaneously.

A buffer layer 210 having a predetermined thickness is provided or formed on a substrate 200 having a thin film transistor (TFT) formed thereon. The TFT includes a polysilicon pattern 222, a gate electrode 232, and source and drain electrodes 250 and 252 formed thereon. The source and drain regions 220 into which impurities are doped are provided at opposite sides of the polysilicon pattern 222, and a gate insulating layer 230 is formed on the entire surface of the structure and covers the polysilicon pattern 222. The gate electrode 232 is formed on the gate insulating layer 230, and an interlayer insulating layer 240 is formed on gate electrode 232 and the gate insulating layer 230.

A passivation layer 260 having a predetermined thickness is subsequently formed on the entire surface of the structure. The passivation layer 260 is etched by a photolithography process, thereby forming a first via contact hole in the passivation layer 260 that exposes one of the source and drain electrodes 250 and 252, for example, the drain electrode 252. The passivation layer 260 may be formed of a silicon oxide layer, a silicon nitride layer, or a stacked layer thereof.

A first insulating layer 270 is formed on the entire surface of the structure. The first insulating layer 270 may be made from polyimide, benzocyclobutene-series resin, spin on glass (SOG), or acrylate. The first insulating layer 270 planarizes the emission region.

The first insulating layer 270 is subsequently etched by a photolithography process, thereby forming a second via contact hole in the first insulating layer 270 that exposes the first via contact hole.

A reflecting layer (not shown) is subsequently formed on an entire upper surface of the structure. The reflecting layer is made of a material having a high reflectivity, such as aluminum (Al), an aluminum alloy, molybdenum (Mo), titanium (Ti), gold (Au), silver (Ag), palladium (Pd), and the like.

The reflecting layer is etched by photolithography process to form a first reflecting layer pattern 280 in an emission region of the first region A. The first reflecting layer pattern 280 reflects light in the first region A to increase luminance and light efficiency. The first reflecting layer 280 is not formed in the second region B.

A thin layer for a pixel electrode (not shown) is subsequently formed on an entire upper surface of the structure. The pixel electrode thin layer is made of a transparent metal material, such as indium tin oxide (ITO).

The pixel electrode thin layer is etched by photolithography process to form a pixel electrode 282 in each of the first and second regions A and B. The pixel electrode 282 contacts one of the source and drain electrodes 250 and 252 that is exposed by the second via contact hole, for example, the drain electrode 252. As shown in FIG. 2, for example, the pixel electrode 282 in the first region A has a dual layer structure that includes the first reflecting layer pattern 280 and the pixel electrode 282. It is understood that an additional process may be performed so that the pixel electrode 282 in the first region A has a different thickness than the pixel electrode 282 in the second region B.

A second insulating layer (not shown) is subsequently formed on an entire upper surface of the structure. The second insulating layer may be made of, for example, polyimide, benzocyclobutene-series resin, phenol-series resin, or acrylate. The second insulating layer is etched by photolithography process to form a second insulating layer pattern 290.

An emission layer 284 is subsequently formed in the emission region. The emission layer 284 may be formed using a low molecular deposition method, a laser induced thermal imaging method, or the like. The emission layer 284 includes an organic emission layer and at least one of an electron injection layer, an electron transport layer, a hole injection layer, a hole transport layer, and a hole blocking layer.

An opposite electrode 286 is subsequently formed on an entire upper surface of the structure. The opposite electrode 286 is formed having a thickness of approximately 10 to 100 Å in both of the first and second regions A and B. The opposite electrode 286 may be formed of a transparent metal layer, such as an Mg—Ag layer, a Ca—Ag layer, or a Ba—Ag layer.

A second reflecting layer pattern 288 is subsequently formed on or above the opposite electrode 286 in the second region B using a mask that exposes the second region B. The second reflecting layer pattern 288 may be formed of a metal layer having a high reflectivity, e.g., an aluminum (Al) layer, a silver (Ag) layer, a gold (Au) layer, a palladium (Pd) layer, and/or an alloy thereof.

The second reflecting layer pattern 288 is formed to approximately 100 to 3000 Å thick. The second reflecting layer pattern 288 is preferably formed to 500 to 2500 Å thick. The second reflecting layer pattern 288 may be formed by a thermal deposition method, a sputtering method, or the like. The second reflecting layer pattern 288 is preferably formed by a sputtering method to reduce a fabrication process time. The second reflecting layer pattern 288 may be formed using the sputtering method because the opposite electrode 286 is approximately 10 to 100 Å thick. Further, the opposite electrode in the second region B is a stacked structure of the opposite electrode 286 and the second reflecting layer pattern 288.

A transparent sealing substrate is subsequently applied or provided on the opposite electrode, thereby completing the fabrication of the OLED.

As described above, according to the present invention, an opposite electrode is formed using the same material in the top emission region and the bottom emission region by a single process, thereby simplifying a fabrication process, reducing a fabrication time, and increasing fabrication output without adversely affecting the electrical and/or optical characteristics of the display.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating an organic light emitting display, comprising:
   forming two first electrodes above a substrate having a top emission region and a bottom emission region, the two first electrodes being formed in the top emission region and the bottom emission region, respectively;
   forming a first emission layer in the top emission region and forming a second emission layer in the bottom emission region, the first emission layer and the second emission layer being separated by an insulating layer;
   forming a second electrode on the emission layer in the top emission region and bottom emission region; and
   selectively forming a reflecting layer pattern on the second electrode in the bottom emission region,
   wherein the first electrode of the top emission region is spaced apart from the first electrode of the bottom emission region, and the first electrode of the top emission region is formed of the same material as the first electrode of the bottom emission region.

2. The method of claim 1, further comprising:
   forming at least one thin film transistor between the substrate and the first electrode.

3. The method of claim 1, wherein the first electrode is a pixel electrode.

4. The method of claim 3, further comprising:
   forming a reflecting layer pattern below the pixel electrode in the top emission region.

5. The method of claim 1, wherein the second electrode is an opposite electrode.

6. The method of claim 1, wherein the second electrode comprises a transparent metal layer.

7. The method of claim 6, further comprising:
   forming the second electrode from one of an Mg—Ag layer, a Ca—Ag layer, or a Ba—Ag layer.

8. The method of claim 1, further comprising:
   forming the second electrode from one of an Mg—Ag layer, a Ca—Ag layer, or a Ba—Ag layer.

9. The method of claim 1, wherein the second electrode is approximately 10 to 100 Å thick.

10. The method of claim 1, wherein the reflecting layer pattern comprises an aluminum layer, a silver layer, a gold layer, a palladium layer, or an alloy thereof.

11. The method of claim 1, wherein the reflecting layer pattern is approximately 100 to 3000 Å thick.

12. The method of claim 1, wherein the reflecting layer pattern is approximately 500 to 2500 Å thick.

13. The method of claim 1, further comprising:
   forming the reflecting layer pattern using a thermal deposition technique.

14. The method of claim 1, further comprising:
   forming the reflecting layer pattern using a sputtering technique.

15. The method of claim 1, further comprising:
   using a mask that exposes the second region to selectively form the reflecting layer pattern on the second electrode in the bottom emission region.

16. A method of forming an organic light emitting display substrate having a top emission region and a bottom emission region, comprising:
   forming a pixel electrode in the top emission region and the bottom emission region;
   forming a first emission layer in the top emission region and forming a second emission layer in the bottom emission region, the first emission layer and the second emission layer being separated by an insulating layer;
   forming an opposite electrode on an entire surface of the substrate; and
   selectively forming a reflecting layer on the opposite electrode formed in the bottom emission region;
   wherein the pixel electrode of the top emission region is spaced apart from the pixel electrode of the bottom emission region, and the pixel electrode of the top emission region is simultaneously formed with the pixel electrode of the bottom emission region.

17. The method of claim 16, wherein the reflecting layer is approximately 500 to 2500 Å thick.

18. The method of claim 17, wherein the opposite electrode of the organic light emitting display substrate is simultaneously formed on the top emission region and the bottom emission region.

* * * * *